US009318668B2

(12) United States Patent
Hong et al.

(10) Patent No.: US 9,318,668 B2
(45) Date of Patent: Apr. 19, 2016

(54) PHOSPHOR AND LIGHT EMITTING DEVICE HAVING THE SAME

(71) Applicant: LG INNOTEK CO., LTD., Seoul (KR)

(72) Inventors: Ki Ho Hong, Seoul (KR); Hyun Goo Kang, Seoul (KR); Ji Hye Kim, Seoul (KR); Ji Wook Moon, Seoul (KR); Ga Yeon Lee, Seoul (KR); Jae Moon Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/330,911

(22) Filed: Jul. 14, 2014

(65) Prior Publication Data

US 2015/0014725 A1    Jan. 15, 2015

(30) Foreign Application Priority Data

Jul. 12, 2013 (KR) ........................ 10-2013-0082490

(51) Int. Cl.
*H01L 33/50* (2010.01)
*C09K 11/08* (2006.01)
*C09K 11/77* (2006.01)

(52) U.S. Cl.
CPC .......... *H01L 33/502* (2013.01); *C09K 11/0838* (2013.01); *C09K 11/7706* (2013.01); *C09K 11/7721* (2013.01); *C09K 11/7734* (2013.01); *H01L 33/504* (2013.01)

(58) Field of Classification Search
CPC ............. H01L 33/504; C09K 11/0883; C09K 11/7734; C09K 11/7774; C09K 11/0838; C09K 11/7706; C09K 11/7715; C09K 11/7721; C09K 11/7728
See application file for complete search history.

(56) References Cited

U.S. PATENT DOCUMENTS

| 7,646,032 | B2 | 1/2010 | Radkov et al. |
| 2008/0203414 | A1 | 8/2008 | Yen et al. |
| 2009/0146549 | A1* | 6/2009 | Kimura et al. ................. 313/503 |
| 2009/0243467 | A1* | 10/2009 | Shimizu ............. C09K 11/7734 313/503 |
| 2013/0020931 | A1 | 1/2013 | Ko et al. |
| 2014/0284636 | A1* | 9/2014 | Yamakawa et al. ............. 257/88 |

FOREIGN PATENT DOCUMENTS

EP        2 056 366 A1    5/2009

OTHER PUBLICATIONS

Sakuma et al., "White Light-Emitting Diode Lamps Using Oxynitride and Nitride Phosphor Materials", IEEE Trans. Electron., vol. E88-C, No. 11, Nov. 2005, pp. 2057-2064.

* cited by examiner

*Primary Examiner* — Yu Chen
(74) *Attorney, Agent, or Firm* — Birch, Stewart, Kolasch & Birch, LLP

(57) ABSTRACT

Disclosed are a phosphor and a light emitting device having the same. The light emitting device includes a light emitting chip, a plurality of phosphors to absorb a portion of light emitted from the light emitting chip and to emit lights having mutually different peak wavelengths, and a molding member provided on the light emitting chip and including the phosphors. The phosphors include a first phosphor to emit light having a first peak wavelength, a second phosphor to absorb the portion of the light emitted from the light emitting chip and to emit light having a second peak wavelength, and a third phosphor to absorb the portion of the light emitted from the light emitting chip and to emit light having a third peak wavelength. The first to third peak wavelengths have mutually different color spectrums, and a light emission spectrum in which the first to third peak wavelengths are mixed with each other has a luminous intensity having a substantially flat section in at least 30 nm at a peak wavelength thereof.

19 Claims, 12 Drawing Sheets

PHOSPHOR AND LIGHT EMITTING DEVICE HAVING THE SAME

The present application claims priority under 35 U.S.C. §119(a) of Korean Patent Application No. 10-2013-0082490 filed on Jul. 12, 2013, which is hereby incorporated by reference in its entirety.

BACKGROUND

The embodiment relates to a phosphor and a light emitting device having the same. The light emitting device may be included in a lighting system.

A LED (Light Emitting Device) is a device having a characteristic of converting electrical energy into light energy. For example, the LED may represent various colors by adjusting the compositional ratio of compound semiconductors.

For instance, a nitride semiconductor represents superior thermal stability and wide bandgap energy so that the nitride semiconductor has been spotlighted in the field of optical devices and high-power electronic devices. In particular, blue, green, and UV light emitting devices employing the nitride semiconductor have already been commercialized and extensively used.

A LED of emitting white color light employs secondary light source to emitting light from phosphor by applying the phosphor. In general, the LED is implemented through a scheme of applying YAG:Ce phosphor representing yellow color to a blue LED.

However, according to the scheme described above, due to quantum deficits and re-radiation efficiency caused by secondary light, the efficiency is degraded and the color rendering is not easy.

Therefore, since a white LED backlight according to the related art has the combination of a blue LED and a yellow phosphor, the white LED backlight lacks green and red components, so that colors are unnaturally represented. For this reason, the white LED backlight has been limitedly applied to a screen of a cellular phone or a laptop computer. However, the white LED backlight according to the related art has been extensively commercialized because the white LED backlight is easily driven and remarkably economical.

In general, it is well known to those skilled in the art that the phosphor material may include a silicate, a phosphate, an aluminate, or a sulfide for a host material and a transition metal or a rare earth metal is used at the center of light emission. For example, although silicate phosphor has been used for a backlight unit or a lighting device, the silicate phosphor is weak to moisture so the reliability of the silicate phosphor is inferior to any other phosphors.

Meanwhile, a phosphor, which is pumped by a pumping light source having high energy such as ultraviolet light or blue light to emit visible light, has been mainly developed with respect to a white LED. However, if the phosphor according to the related art is exposed to the pumping light source, the brightness of the phosphor is degraded.

SUMMARY

The embodiment provides a phosphor having improved color reproducibility and a light emitting device having the same.

The embodiment provides a light emitting device having an improved peak section of luminous intensity in the light emission spectrum of a mixture of lights emitted from yellow, green, and red phosphors.

The embodiment provides a phosphor and a light emitting device having the same, in which a flat section or a horizontal linear section of a luminous intensity of a light emission spectrum is in the range of 30 nm to 50 nm.

The embodiment provides a phosphor and a light emitting device having the same, capable of emitting light having a light emission spectrum having a gradient of a luminous intensity having a deviation of 0.4% or less.

The embodiment provides a light emitting device having phosphors, in which a luminous intensity at a peak wavelength of a light emission spectrum of the phosphors has a flat section in a range of 35 nm to 40 nm, and has a gradient deviation of 0.4% or less.

The embodiment provides a light emitting device having phosphors, in which luminous intensities at peak wavelengths of mutually different light emission spectrums have a flat section in the range of 35 nm to 40 nm and have a gradient deviation of 0.4% or less.

According to the embodiment, there is provided a light emitting device including a light emitting chip, a plurality of phosphors to absorb a portion of light emitted from the light emitting chip and to emit lights having mutually different peak wavelengths, and a molding member provided on the light emitting chip and including the phosphors. The phosphors include first to third phosphors to emit first to third peak wavelengths, the first to third peak wavelengths have mutually different color spectrums, and a light emission spectrum in which the first to third peak wavelengths are mixed with each other has a luminous intensity having a flat section in at least 30 nm at a peak wavelength thereof.

According to the embodiment, there is provided a light emitting device including a light emitting chip, a plurality of phosphors to absorb a portion of light emitted from the light emitting chip and to emit lights having mutually different peak wavelengths, and a molding member provided on the light emitting chip and comprising the phosphors, the phosphors have mutually different color spectrums, a light emission spectrum of a mixture of lights emitted from the phosphors comprises yellow light, and a luminous intensity at a peak wavelength of the light emission spectrum has a substantially flat section in a range of 35 nm to 40 nm.

According to the embodiment, there is provided a phosphor including a first phosphor to emit light having a first peak wavelength, a second phosphor to emit light having a second peak wavelength, and a third phosphor to emit light having a third peak wavelength, the first to third phosphors pumps blue light or ultraviolet light to emit lights having mutually different color spectrums, the first to third phosphors comprise mutually different nitride phosphors, a light emission spectrum in which the first to third peak wavelengths are mixed with each other emits yellow light, a luminous intensity at a peak wavelength of the light emission spectrum has a substantially flat section in a range of 30 nm to 40 nm, and the flat section has a gradient having a deviation of 0.4% or less based on a horizontal linear line of the luminous intensity at the peak wavelength.

DETAILED DESCRIPTION OF THE EMBODIMENTS

In the description of embodiments, it will be understood that when a layer (or film), region, pattern or structure is referred to as being 'on' or 'under' another layer (or film), region, pad or pattern, the terminology of 'on' and 'under' includes both the meanings of 'directly' and 'indirectly'. Further, the reference about 'on' and 'under' each layer will be made on the basis of drawings.

Figure 1:
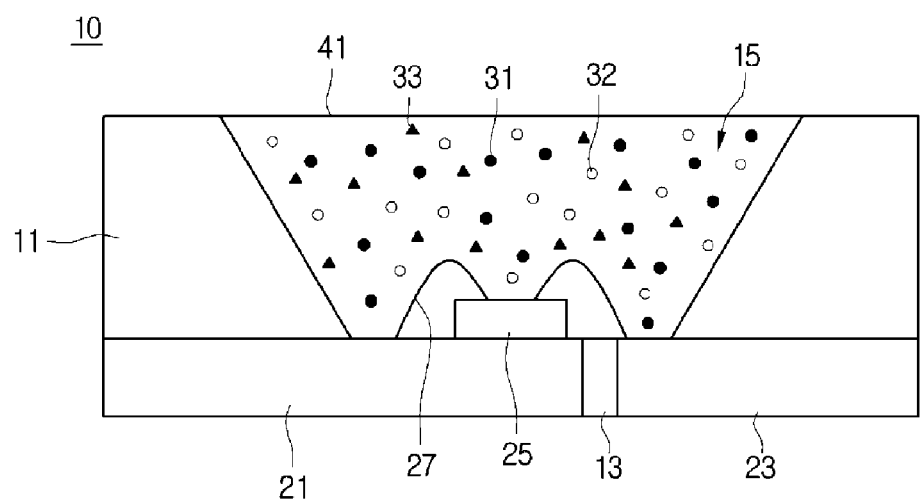
FIG. 1 is a sectional view showing a light emitting device according to a first embodiment including a phosphor according to the embodiment.

FIG. 1 is a sectional view showing a light emitting device according to a first embodiment.

Referring to FIG. 1, a light emitting device 10 includes a body 11, first and second lead frames 21 and 23, a light emitting chip 25, and a molding member 41 having a plurality of phosphors 31, 32, and 33.

The body 11 may include a material representing reflectance higher than transmittance with respect to the wavelength emitted from the light emitting chip 31. For example, the body 11 may include a material representing at least 70% of reflectance. If the material constituting the body 11 represents at least 70% of reflectance, the material constituting the body 11 may include a non-transmissive material. The body 11 may include a resin-based insulating material. For example, the body 11 may include a resin material, such as polyphthalamide (PPA). The body 11 may include a metal oxide added to a resin material such as epoxy or silicon, and the metal oxide may include at least one of $TiO_2$, $SiO_2$, and $Al_2O_3$, and may be added with the content of at least 3 wt % into the body 11. Accordingly, the body 11 may effectively reflect incident light. In this case, if the content of the metal oxide added into the body 11 is 3 wt % or less, the reflection efficiency may be degraded. If the reflection efficiency is degraded, the distribution of the light orientation angle may be varied. Alternatively, the body 11 may include a resin material representing transmittance or a resin material having the phosphor according to the embodiment to convert the wavelength of incident light.

The body 11 may include thermal setting resin including silicon, epoxy resin, thermosetting resin such as a plastic material, a high heat resistance material, or a high light resistance material. In addition, the body 11 may selectively include acid anhydride, an antioxidant, a release agent, an optical reflector, an inorganic filling agent, a curing catalyst, a light stabilizer, a lubricant, or a titanium dioxide. The body 11 may be molded by using at least one selected from the group consisting of epoxy resin, modified epoxy resin, silicon resin, modified silicon resin, acrylic resin, and urethane resin. For instance, the body 11 can be formed by using B-stage solid epoxy resin composition, which can be obtained by mixing the epoxy resin, such as triglycidylisocyanurate or hydride bisphenol A diglycidylether, with the acid anhydride promoter, such as hexahydro phthalic anhydride, 3-methyl hexahydro phthalic anhydride or 4-methyl hexahydro phthalic anhydride, and then partially hardening the mixture after adding DBU (1.8-Diazabicyclo(5,4,0)undecene-7) serving as a hardening accelerator and ethylene glycol, titanium oxide pigment or glass fiber serving as a promoter to the epoxy resin, but the embodiment is not limited thereto.

In addition, a light shielding material or a dispersing agent is added in the body 11, thereby reducing transmitting light. In addition, in order to have a predetermined function, the body 11 includes a mixture obtained by properly mixing thermal setting resin with at least one selected from the group consisting of a dispersing agent, pigments, phosphors, reflective materials, light shielding materials, a light stabilizer, and a lubricant.

The body 11 may include a transmissive material. The transmissive material may include a material to transmitting at least 70% of light emitted from the light emitting chip 25.

The body 11 may be recessed from a top surface thereof by a predetermined depth or include a cavity 15 having an open upper portion. The cavity 15 may be formed in a shape such as concave cup structure, an open structure, or a recess structure, but the embodiment is not limited thereto.

The lead frames 21 and 23 may be coupled with the body 11. For example, the lead frames 21 and 23 may include two or three frames. The lead frames 21 and 23 include first and second lead frames 21 and 23 separated from each other. The first and second lead frames 21 and 23 may be disposed on a floor of the cavity 15, but the embodiment is not limited thereto. Lower portions of the first and second lead frames 21 and 23 may be exposed to a lower portion of the body 11, or portions of the first and second lead frames 21 and 23 may be bent. The first and second lead frames 21 and 23 may include a metallic material, for example at least one of titanium (Ti), copper (Cu), nickel (Ni), gold (Au), chromium (Cr), tantalum (Ta), platinum (Pt), tin (Sn), silver (Ag), and phosphorus (P), and may be formed in a single layer or a multi-layer. The first and second lead frames 21 and 23 may have thicknesses of at least 0.15 mm, for example at least 0.18 mm.

As another example of the first and second lead frames 21 and 23, at least one of the first and second lead frames 21 and 23 may be formed in the concave cut shaped-structure or a bent structure, or may include a recessed groove or a hole for the coupling with the body 11, but the embodiment is not limited thereto.

The light emitting chip 25 may be disposed on at least one of the first and second lead frames 21 and 23, and may be bonded to the at least one of the first and second lead frames 21 and 23 by an adhesive member (not shown). For example, the light emitting chip 25 may be bonded to the first lead frame 21. The light emitting chip 25 may be connected with the at least one of the first and second lead frames 21 and 23 through at least one connection member 27, but the embodiment is not limited thereto. The connection member 27 includes a conductive material, for example a wire including a metallic material.

The light emitting chip 25 emits a peak wavelength in the range of 400 nm to 600 nm from among a wavelength range of visible light. The light emitting chip 25 may emit a peak wavelength of blue color.

The cavity 15 is provided therein with the molding member 41, and the molding member 41 includes the phosphors 31, 32, and 33 according to the embodiment. The phosphors 31, 32, and 33 emit mutually different peak wavelengths and include phosphors having mutually different materials. The phosphors 31, 32, and 33 may include phosphors to emit at least three types of lights. According to the embodiment, for the convenience of explanation, three types of phosphors will be described below as an example. The phosphors 31, 32, and 33 include mutually different nitride phosphors. The light emission spectrum of the mixture of lights emitted from the phosphors 31, 32, and 33 may represent a peak intensity having a flat section in the range of 30 nm to 50 nm and the mixture of the lights may be yellow light. The phosphors 31, 32, and 33 absorb blue light or ultraviolet light so that the phosphors 31, 32, and 33 may pump lights representing mutually different colors, for example green, yellow, and red light.

In this case, at least 5 wt % of the phosphors 31, 32, and 33, in detail, at least 9 wt % of the phosphors 31, 32, and 33 may be contained in the molding member 41. In addition, 8 wt % to 25 wt % of the phosphors 31, 32, and 33 may be contained in the molding member 41.

For example, the phosphors 31, 32, and 33 may include the first phosphor 31 to emit a first peak wavelength, the second phosphor 32 to emit a second peak wavelength, and a third phosphor 33 to emit a third peak wavelength.

The first to third phosphors 31, 32, and 33 include green, yellow, and red phosphors, respectively. The first to third phosphors 31, 32, and 33 include phosphors to emit mutually different peak wavelengths, for example nitride phosphors. The light emission spectrum of the mixture of the first to third peak wavelengths may be at least 30 nm in which the luminous intensity of the peak wavelength has a flat section.

The first phosphor 31 is a green phosphor, includes N, and includes at least two selected from the group consisting of La, Si, Ba, Al, Ca, and Sr. If a phosphor host material and $Eu^{2+}$ ions serving as an activator are added to the green phosphor, the composition of the green phosphor is pumped by ultraviolet, near-ultraviolet, purple, and blue lights to emit green series of lights. For example, the first phosphor 31 may include $La_3Si_6N_{11}:Ce^{3+}$. According to another example, the first phosphor 31 may include at least one of $BaSiN_2:Eu^{2+}$, $Sr_{1.5}Al_3Si_9N_{16}:Eu^{2+}$, $Ca_{1.5}Al_3Si_9N_{16}:Eu^{2+}$, $CaSiAl_2O_3N_2:Eu^{2+}$, $SrSiAl_2O_3N_2:Eu^{2+}$, $CaSi_2O_2N_2:Eu^{2+}$, $SrSi_2O_2N_2:Eu^{2+}$, $BaSi_2O_2N_2:Eu^{2+}$, $Sr_2Si_5N_8:Ce^{3+}$, and $Ca_{1.5}Al_3Si_9N_{16}:Ce^{3+}$.

The second phosphor 32 is a yellow phosphor, includes N, and includes at least two selected from the group consisting of Mg, Ca, Sr, Ba, and Zn. If a phosphor host material and $Eu^{2+}$ ions serving as an activator are added to the composition of the yellow phosphor, the composition of the yellow phosphor is pumped by ultraviolet, near-ultraviolet, purple, and blue lights to emit yellow series of lights representing a warm hue. For example, the second phosphor 32 may include $(Sr,Ba)_1Si_2O_2N_2:Eu^{2+}$. According to another example, the second phosphor 32 may include at least one of phosphors expressed as $(Sr_xCa_{1-x})_2Si_5N_8:Eu^{2+}$, $Sr_2Si_5N_8:Eu^{2+}$, $Ca_2Si_5N_8:Eu^{2+}$, $Sr_xCa_{1-x}Si_7N_{10}:Eu^{2+}$, $SrSi_7N_{10}:Eu^{2+}$, $CaSi_7N_{10}:Eu^{2+}$, $Ca_{1.5}Al_3Si_9N_{16}:Eu^{2+}$, and $CaSiA_{12}O_3N_2:Eu^{2+}$.

The third phosphor 33 is a red phosphor, includes N, and includes at least one selected from the group consisting of Be, Mg, Ca, Sr, Ba, and Zn, and at least one selected from the group consisting of C, Si, Ge, Sn, Ti, Zr, and Hf. The red phosphor may include a nitride-based phosphor activated by at least one selected from among rare-earth elements. In particular, the red phosphor may be expressed in a compositional formula or a chemical formula of $SrAlSiN_3$ or $CaAlSiN_3$. For example, the red phosphor may include a composition having a plurality of alkaline earth metal element among materials having compositional formulas of $(Sr,Ca)AlSiN_3$, $(Sr, Mg)AlSiN_3$, $(Ca, Mg)AlSiN_3$, and $(Sr, Ca, Ba)AlSiN_3$. In addition, an oxygen (O) element of the compositional formulas is an impurity element introduced in the preparation of a phosphor composition. For example, the third phosphor 33 may include a compositional formula of $(Sr, Ca)AlSiN_3:Eu^{2+}$. According to another example, the third phosphor 33 may include at least one of $Sr_2Si_5N_8:EU^{2+}$, $SrSiN_2:EU^{2+}$, $SrAlSiN_3:Eu^{2+}$, $CaAlSiN_3:EU^{2+}$, and $Sr_2Si_4AlON_7:Eu^{2+}$.

The activator for the first to third phosphors 31, 32, and 33 may be $Eu^{2+}$ or may be a metal ion properly selected from various rare-earth ions or transition metal ions according to necessaries. For example, the activator may be a trivalent rare-earth metal ion, such as $Ce^{3+}$, $Pr^{3+}$, $Nd^{3+}$, $Sm^{3+}$, $EU^{3+}$, $Gd^{3+}$, $Tb^{3+}$, $Dy^{3+}$, $Ho^{3+}$, $Er^{3+}$, $Tm^{3+}$, or $Yb^{3+}$, a divalent rare-earth metal ion, such as $Sm^{2+}$, $Eu^{2+}$, and $Yb^{2+}$, a divalent transition metal ion, such as $Mn^{2+}$, a trivalent transition metal ion, such as $Cr^{3+}$ or $Fe^{3+}$, or a tetravalent transition metal ion such as $Mn^{4+}$.

Regarding the contents of phosphors contained in the molding member 41, the content of the first phosphor 31 may be different from those of the second and third phosphors 32 and 33. For example, the content of the first phosphor 31 may be greater than the sum of the contents of the second and third phosphors 32 and 33.

When comparing the contents of the phosphors with each other, the content of the first phosphor 31 may be at least three times greater than the content of the second phosphor 32. The content of the first phosphor 31 may be at least seven times greater than that of the third phosphor 33. For example, on the assumption that the sum of the contents of the first to third phosphors 31 to 33 is 100%, the content (a) of the first phosphor 31 may exceed 70% of the sum of the contents of the first to third phosphors 31 to 33. For example, the content (a) of the first phosphor 31 may satisfy the range of 70%<a≤79%, in detail, 70%<a<79%. The content (b) of the second phosphor 32 may be less than 29% of the sum of the contents. The content (b) of the second phosphor 32 may satisfy the range of 11%≥b>29%, in detail, 11%>b>29%. The content (c) of the third phosphor 33 may be equal to or less than 10%. The content (c) of the third phosphor 33 may satisfy the range of 1%<c≤10%, in detail, 1%<c<10%.

The content of the first phosphor 31 is at least 64% of the content of the third phosphor 33, in detail, in the range of 64% to 74%. The content of the first phosphor 31 is at least 53% of the content of the second phosphor 32, in detail, in the range of 53% to 68% of the content of the second phosphor 32.

The first phosphor 31 absorbs the light emitted from the light emitting chip 25 to emit light having a green spectrum. The second phosphor 32 absorbs the light emitted from the light emitting chip 25 to emit light having a yellow spectrum. The third phosphor 33 absorbs the light emitted from the light emitting chip 25 to emit light having a red spectrum. For example, the light emitting chip 25 may emit light having a wavelength selected in the range from an ultraviolet light wavelength band to a visible light wavelength band. Hereinafter, the case of blue light will be described below. The spectrum of the blue light includes the range of 440 nm to 460 nm.

Figure 2:
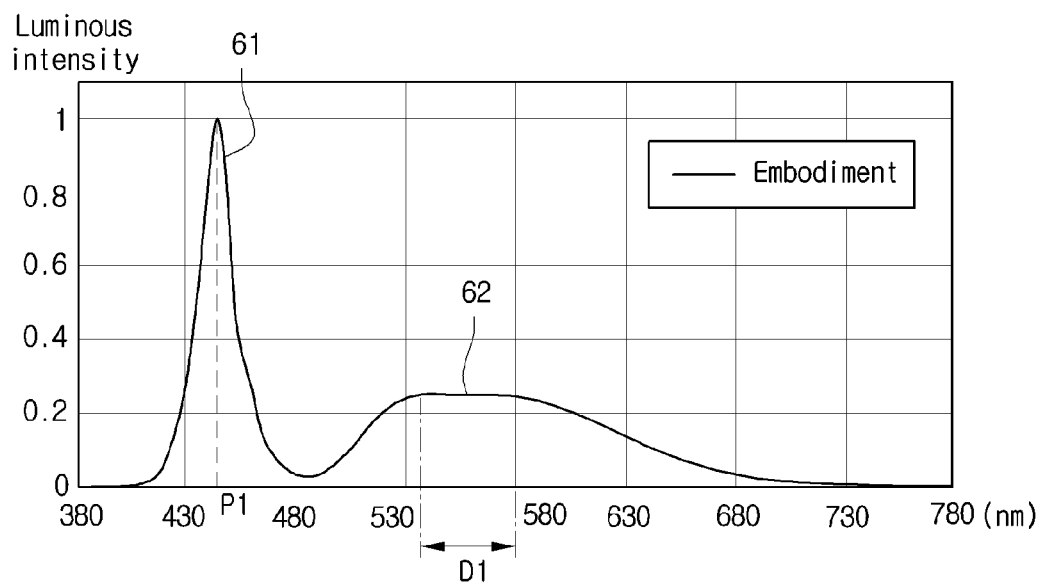
FIG. 2 is a graph showing a light emission spectrum by the light emitting chip and the phosphor of FIG. 1.

The light emitting device 10 emits light representing a desirable color as the blue light emitted from the light emitting chip 25 is mixed with lights emitted from the first to third phosphors 31, 32, and 33. As shown in FIGS. 1 and 2, a first light emission spectrum 61 represents a spectrum of light emitted from the light emitting chip 25, and a second light emission spectrum 62 represents a spectrum of the mixture of lights emitted from the first to third phosphors 31 to 33. The second light emission spectrum 62 represents yellow light. The light emitting device 10 emits white light by the first light emission spectrum 61 and the second light emission spectrum 62. According to another example, if the light emitting chip 25 emits ultraviolet light, the first to third phosphors according to the embodiment may be applied to the light emitting device 10, and the light emitting device 10 may include a blue phosphor or a blue chip, but the embodiment is not limited thereto.

The first to third phosphors 31, 32, and 33 may include particles representing intrinsic colors, respectively, or may be provided in the form of one particle in which mutually different fluorescent particles representing two colors or three colors are mixed with each other.

The second light emission spectrum 62 represents yellow light, that is, greenish yellow light by the lights of the first to third phosphors 31, 32, and 33. The second light emission spectrum 62 includes a peak wavelength in the range of 520 nm to 600 nm. The peak wavelength of the second light emission spectrum 62 may be slightly shifted according to the contents of the first to third phosphors 31, 32, and 33, but the embodiment is not limited thereto.

In the second light emission spectrum 62 according to the embodiment, a flat section D1 may be provided with respect to the luminous intensity at peak wavelengths. In other words, the luminous intensity at the peak wavelength has the flat section D1 by the contents of the first to third phosphors 31, 32, and 33. At the flat section D1, the light emission spectrum of at least three types of phosphors may be detected.

Figure 3:
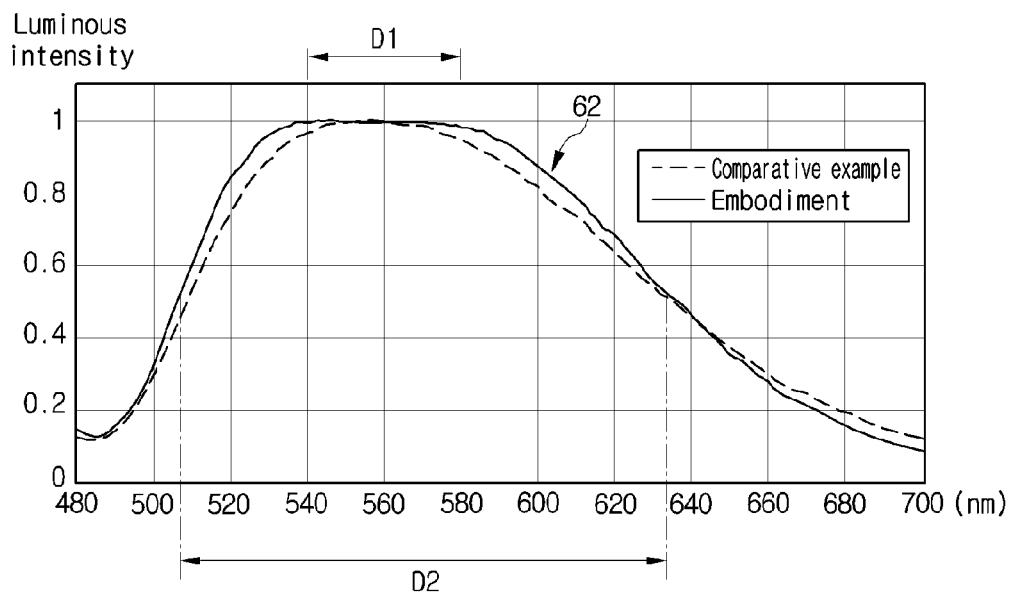
FIG. 3 is a graph showing a light emission spectrum of the phosphor normalized based on that of the light emitting chip of FIG. 2.

As shown in FIGS. 2 and 3, the flat section D1 of the second light emission spectrum 62 is a section where the peak wavelengths have the same luminous intensity, and has the range of 30 nm to 50 nm, for example the range of 35 nm to 40 nm. In other words, the flat section D1 having the same luminous intensity may be a section having at least 35 nm. If the peak wavelengths have the same intensity, the gradient deviation of the luminous intensity at the peak wavelength may be 0.4% or less. For example, in the flat section D1, the luminous intensity at the peak wavelength may have the deviation of ±0.4% or less from a horizontal line. The flat section D1 may be defined as a horizontal section or a horizontal line section, and the luminous intensity at the peak wavelength may be defined as peak intensity. The luminous intensities at peak wavelengths of mutually different light emission spectrums from the phosphors 31, 32, and 33 according to the embodiment represent the flat section in the range of 30 nm to 30 nm, in detail, the range of 35 nm to 40 nm and the gradient deviation of 0.4% or less.

The flat section D1 of the luminous intensity at the peak wavelength of the second light emission spectrum 62 may be smaller than a full width half max (FWHM) of the second light emission spectrum 62, for example 0.5 or less of a FWHM D2 of the second light emission spectrum 52. The flat section D1 may be in the range of 0.25 to 0.41 of the FWHM D2 of the second light emission spectrum 62. The flat section D1 may be in the range of 0.29 to 0.33 of the FWHM of the second light emission spectrum 62.

The second light emission spectrum 62 has the flat section D1 or the horizontal linear section at the peak wavelength range of 540 nm to 580 nm. As the flat section D1 is increased, the color reproduction rate is increased, and a cover area of a standard color space (sRGB) is widened. In addition, since the second light emission spectrum having the flat section D1 approximates a luminosity curve (e.g., 555 nm), so that the speed of light can be increased. In addition, when the light emitting device 10 is applied for lighting, a color rendering index (CRI) can be realized, and a correlated color temperature (ΔCCT) can be improved.

In this case, a comparative example shown in FIG. 3 shows a light emission spectrum by a YAG yellow phosphor. The second light emission spectrum 62 of the embodiment has a feature in that the peak wavelength of the second light emission spectrum 62 according to the embodiment has a wider flat section D1 as compared with that of the light emission spectrum of the comparative example. In addition, the FWHM D2 of the second light emission spectrum 62 according to the embodiment may be wider than the FWHM of the comparative example. The FWHM D2 of the second light emission spectrum 62 may be about 120 nm (=630 nm−510 nm), but the embodiment is not limited thereto. The light emission spectrum of each of the first to third phosphors 31, 32, and 33 according to the embodiment may cover about 120 nm, but the embodiment is not limited thereto. The FWHM D2 may be varied depending on the contents of the first to third phosphors 31, 32, and 33.

The comparison of the embodiment with the comparative example in optical properties is shown in Table 1. The second light emission spectrum of the mixture of lights emitted from the first to third phosphors 31, 32, and 33 according to the embodiment and the light emission of light emitted from a YAG phosphor according to the comparative example will be described below.

TABLE 1

| Classification | | YAG | Embodiment |
|---|---|---|---|
| Optical property | Color coordinates | (0.294, 0.265) | (0.292, 0.263) |
| | Flux (lm) | 100% | 100.8% |
| | Red | (0.644, 0.335) | (0.644, 0.337) |
| | Green | (0.320, 0.610) | (0.316, 0.608) |

TABLE 1-continued

| Classification | YAG | Embodiment |
| --- | --- | --- |
| Blue | (0.158, 0.068) | (0.157, 0.069) |
| NTSC (%) | 69.55 | 69.57 |
| sRGB (%) | 93.27 | 93.71 |

Figure 4:
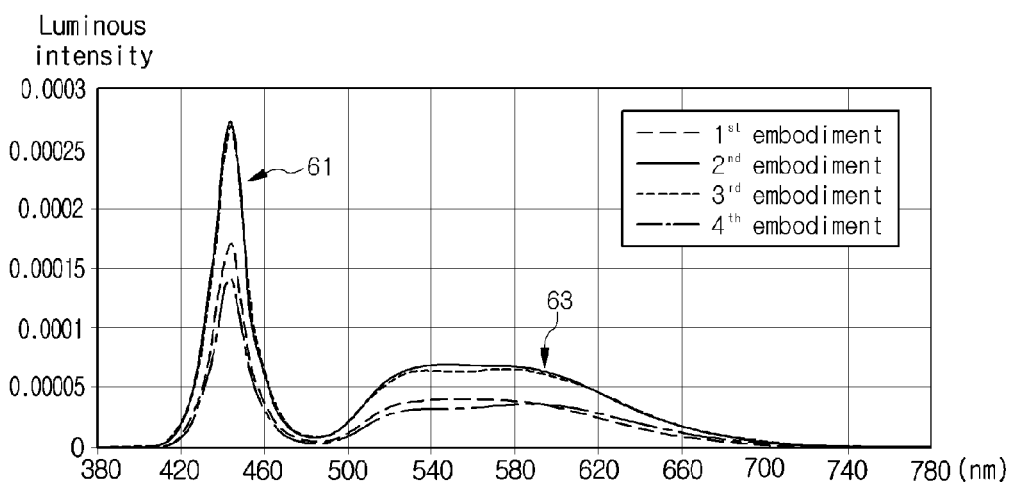
FIG. 4 is a graph showing light emission spectrums according to the first to fourth embodiments depending on the combination ratios of the phosphors according to the embodiment.

FIG. 4 shows the variation in the first light emission spectrum 61 of the light emitting chip according to the contents of the first to third phosphors and the second light emission spectrum 63 by phosphors. The first to fourth embodiments show the first to third phosphors, and a difference is made in content between the first to third phosphors.

Referring to FIG. 4, the first phosphor 31 has a content selected in the range of 74% to 79%, the second phosphor 32 has a content selected in the range of 11% to 21%, and the third phosphor 33 has a content selected in the range of 5% to 10%.

For example, regarding the content ratio of green phosphor to yellow phosphor to red phosphor, the first embodiment shows the content ratio of 71:21:5, the second embodiment shows the content ratio of 75:19:6, and the third embodiment shows the content ratio of 76:17:7. The luminous intensity of the first light emission spectrum 61 may be varied depending on the content ratio of phosphors according to the first to fourth embodiments, but the embodiment is not limited thereto. The second light emission spectrums 63 according to the first to fourth embodiments make a difference in luminous intensity therebetween. The light emission spectrums according to the first to fourth embodiments have a section in which the luminous intensity is flatly represented in the range of 540 nm to 580 nm. In this case, regarding the luminous intensity at the second light emission spectrum 63, the light emission spectrum according to the fourth embodiment has a luminous intensity gradient greater than that of the light emission spectrums according to the first to third embodiments in the range of 540 nm to 580 nm.

Figure 5:
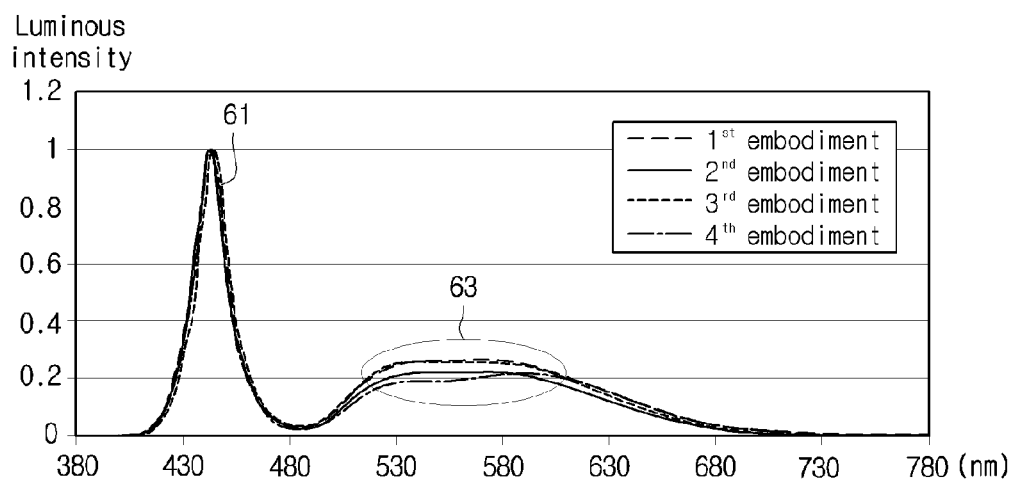
FIG. 5 is a graph showing a light emission spectrum normalized based on a blue spectrum of FIG. 4.

FIG. 5 is a graph showing the second light emission spectrum when the region of the blue light shown in FIG. 4 is normalized based on the same luminous intensity.

Referring to FIG. 5, the second light emission spectrum 63 of each of the first to fourth embodiments is a spectrum of light pumped by absorbing the light having the first light emission spectrum 61. The second light emission spectrums 63 according to the first to fourth embodiments have a flat section in the range of 530 nm to 580 nm.

Figure 6:
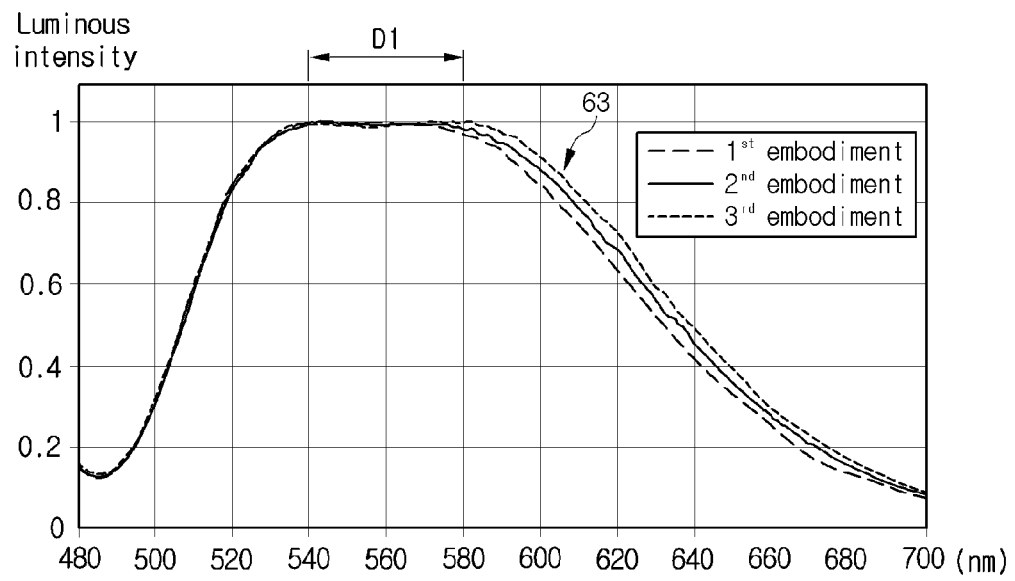
FIG. 6 is a graph showing a spectrum obtained by normalizing the spectrums of phosphors according to the first to third embodiments.

FIG. 6 is a graph showing a spectrum obtained by normalizing the spectrums of phosphors according to the first to third embodiments.

Referring to FIG. 6, the second light emission spectrums 63 according to the first to third embodiments rarely have the difference of the flat section D1 in the range of 530 nm to 570 nm therebetween. In other words, even though the first to third phosphors 31, 32, and 33 have contents different from each other according to the first to third embodiments, the second light emission spectrums 63 have the same flat section D1. The gradient of the second light emission spectrum 63 may be varied depending on the variation in the content of the third phosphor 33 in the wavelength range of 570 nm to 580 nm. The variation of the gradient of the second light emission spectrum 63 is within the range of 0.1 or less based on a horizontal line representing the luminous intensity of 1.

Figure 7:
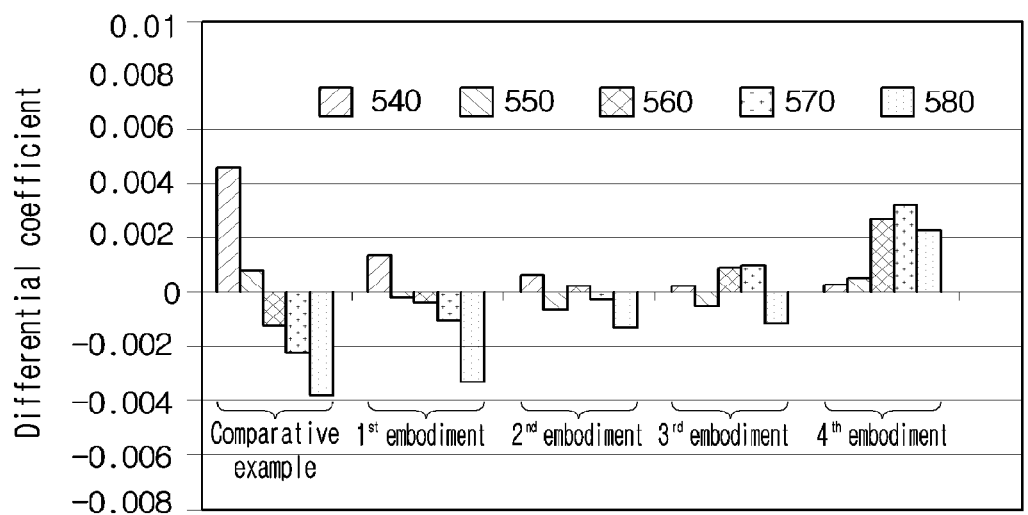
FIG. 7 is a graph showing the differential coefficient of each wavelength of the light emission spectrums according to the first to fourth embodiments shown in FIG. 5 and the comparative example.

FIG. 7 is a graph showing differential coefficients according to the first to fourth embodiments. In FIG. 7, a positive value of the differential coefficient represents that the differential coefficient is greater than zero, and a gradient is inclined in the direction of a reference value (0) or in the direction opposite to that of the reference value (0). A negative value of the differential coefficient represents that the differential coefficient is smaller than zero, and the gradient descends in the direction of the reference value (0) or the direction opposite to that of the reference value (0).

Referring to FIG. 7, the comparative example is a YAG phosphor. Regarding peak wavelength section when that the differential coefficient at the peak wavelength is zero, the gradient at the peak wavelength of 540 nm has the deviation of at least +0.004 from a reference value, and the gradient at the peak wavelength of 580 nm has the deviation of less than −0.004 from the reference value. According to the comparative example, the deviation between the gradients at the peak wavelengths of 540 nm and 580 nm becomes at least 0.008. Accordingly, the flat section according to the comparative example becomes 30 nm or less.

According to the first embodiment, the gradient has the variation of +0.002 or less at the peak wavelength of 540 nm, and the gradient has the variation of −0.004 or less at the peak wavelength of 580 nm. Accordingly, the variation between gradients is less than 0.006 in the peak wavelength range of 540 nm to 580 nm. According to the second embodiment, the gradient has the variation of 0.002 or less in the peak wavelength range of 540 nm to 580 nm. According to the third embodiment, the gradient has the variation of 0.002 or less in the peak wavelength range of 550 nm to 580 nm. According to the fourth embodiment, the gradient has the variation of 0.004 or less in the peak wavelength range of 550 nm to 580 nm. According to the first to fourth embodiments, the gradient has the variation of 0.004 or less in the peak wavelength range of 540 nm to 570 nm, and the gradient has the variation of 0.006 or less in the range of 550 nm to 580 nm. In other words, the second light emission spectrum that is mixed in the contents of the first to third phosphors according to the first to fourth embodiments has the differential coefficient approximating to 0 in the range of 40 nm.

In addition, based on the differential coefficient of 0, the gradient of the light emission spectrum according to the comparative example has the deviation exceeding 0.004 at the peak wavelength of 540 nm, and the gradient of the second light emission spectrum according to the first to fourth embodiments has the deviation of less than 0.004. In addition, since the gradient deviation in the peak wavelength range of 540 nm to 580 nm is 0.004, that is, 0.4% or less based on the differential coefficient of 0 according to the embodiment, the section in the range of 540 nm to 580 nm may be defined as a section having a flat peak wavelength or a section in which the gradient hardly exists. In addition, based on the differential coefficient of 0, the second light emission spectrum according to the second and third embodiments has the gradient deviation of 0.002, that is 0.2% or $2/1000$ or less in the peak wavelength range of 540 nm to 580 nm. Further, In addition, based on the differential coefficient of 0, the second light emission spectrum according to the first and fourth embodiments has the gradient deviation of 0.004, that is 0.4% or $4/1000$ or less in the peak wavelength range of 540 nm to 580 nm.

FIGS. 8 to 11 are graphs showing the differential coefficient of the second light emission spectrum for each wavelength according to the first to fourth embodiments.

Figure 8:
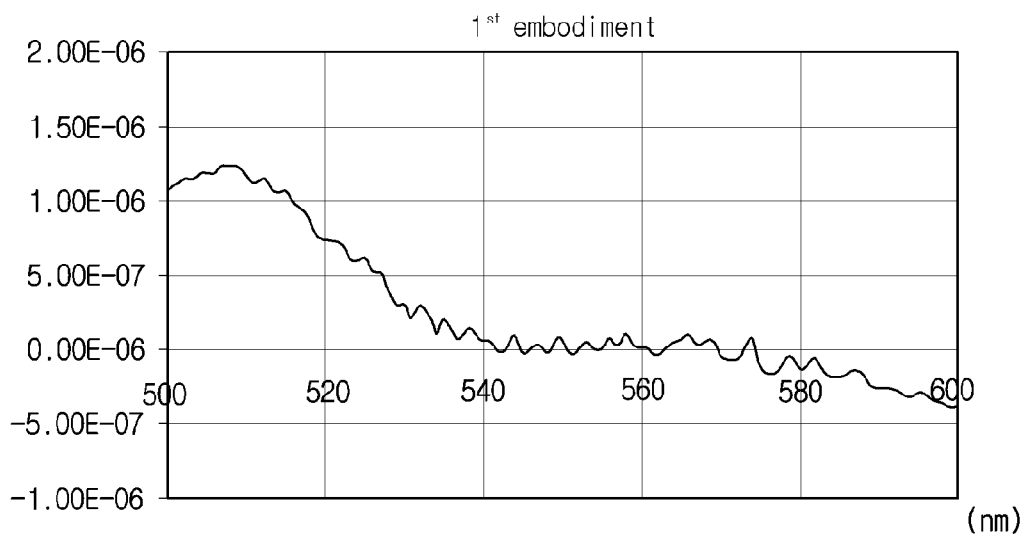
FIGS. 8 to 11 are graphs showing the differential coefficient of the light emission spectrums according to the first to fourth embodiments shown in FIG. 5 at each wavelength.

Referring to FIG. 8, the second light emission spectrum according to the first embodiment has a positive differential coefficient based on the differential coefficient of 0 in the range of 520 nm to 540 nm, has a flat section approximate to the differential coefficient of 0 in the range of 540 nm to 580 nm, and has a negative differential coefficient in the range of 580 nm to 600 nm.

Figure 9:
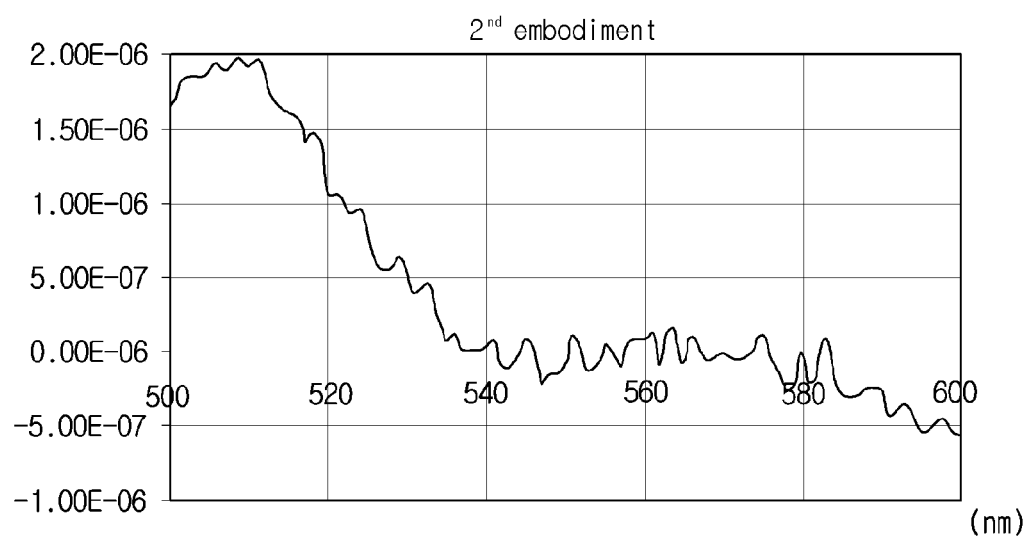

Referring to FIG. 9, the second light emission spectrum according to the second embodiment has a positive differential coefficient based on the differential coefficient of 0 in the range of 520 nm to 540 nm, has a flat section approximate to the differential coefficient of 0 in the range of 540 nm to 580 nm, and has a negative differential coefficient in the range of 580 nm to 600 nm.

Figure 10:
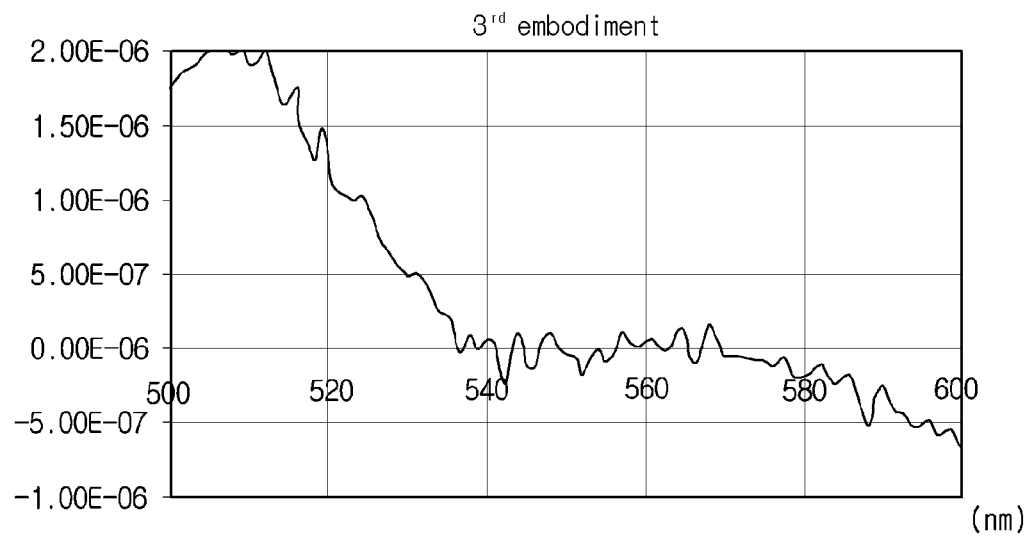

Referring to FIG. 10, the second light emission spectrum according to the third embodiment has a positive differential coefficient based on the differential coefficient of 0 in the range of 520 nm to 540 nm, has a flat section approximate to the differential coefficient of 0 in the range of 540 nm to 580 nm, and has a negative differential coefficient in the range of 580 nm to 600 nm.

Figure 11:
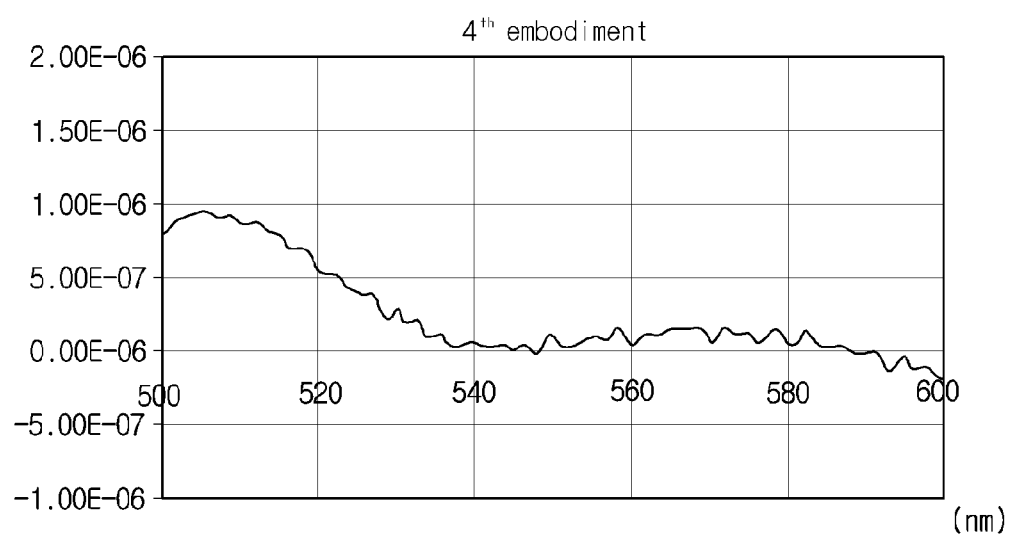

Referring to FIG. 11, the second light emission spectrum according to the fourth embodiment has a positive differential coefficient based on the differential coefficient of 0 in the range of 520 nm to 540 nm, has a flat section approximate to the differential coefficient of 0 in the range of 540 nm to 580 nm, and has a negative differential coefficient in the range of 580 nm to 600 nm.

Figure 12:
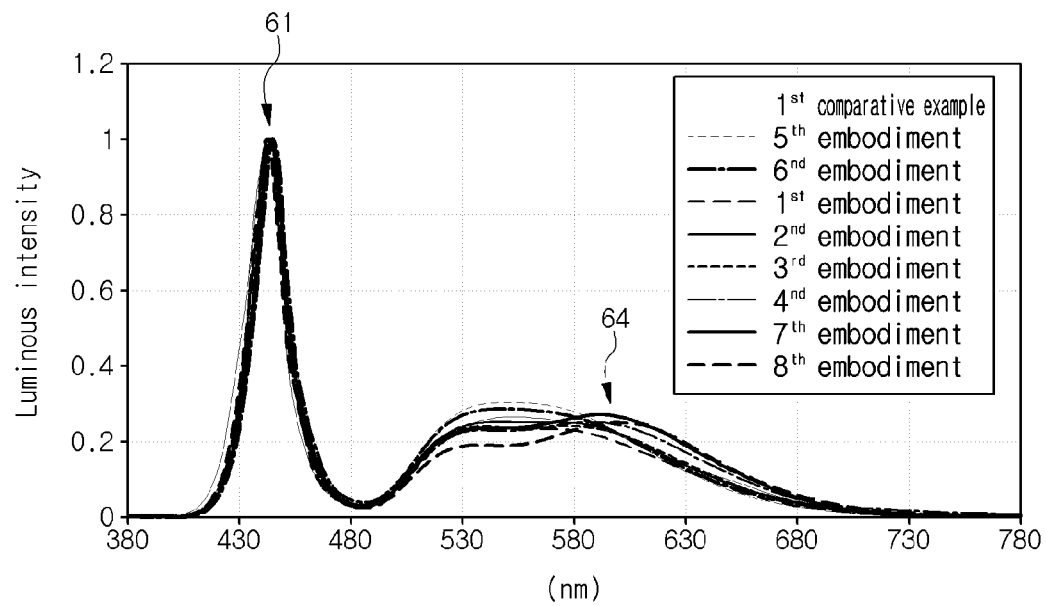
FIG. 12 is a view showing light emission spectrums according to the first comparative example and the first to eighth embodiments.
Figure 13:
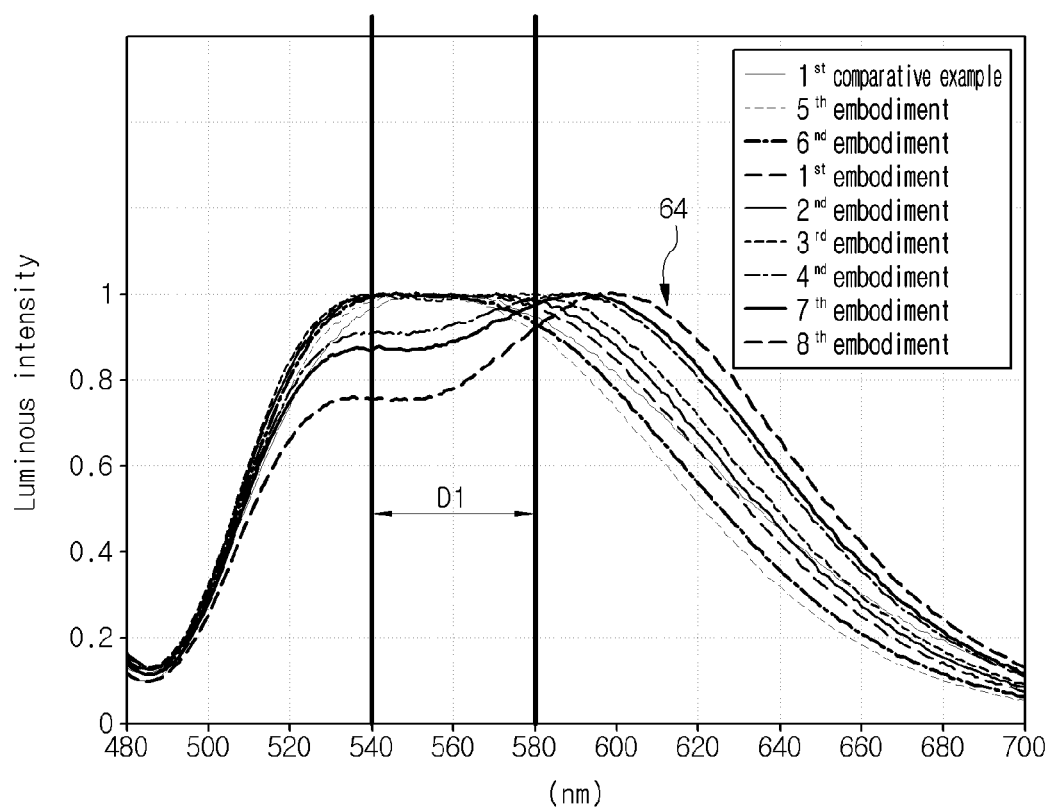
FIG. 13 is a graph showing a light emission spectrum normalized based on a blue spectrum of FIG. 12.
Figure 14:
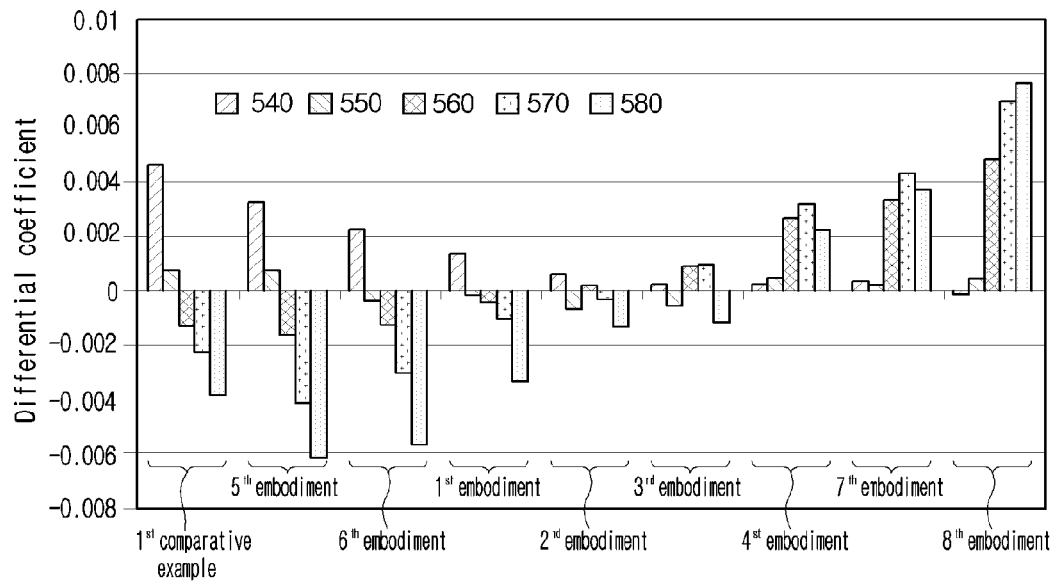
FIG. 14 is a graph showing the differential coefficient of the light emission spectrums according to the comparative example and the first to eighth embodiments shown in FIG. 13 at each wavelength.

FIG. 12 is a graph showing the comparison among the first comparative example and the first to eighth embodiments in the first and second light emission spectrums. FIG. 13 is a graph showing the second light emission spectrums of FIG. 12 normalized based on a phosphor wavelength. FIG. 14 is a graph showing differential coefficients of the second light emission spectrums of FIG. 13.

In FIG. 12, the first comparative example is a light emitting spectrum by a blue light emitting chip and a YAG phosphor, the first to fourth embodiments are the second light emission spectrums disclosed above, and the fifth to eighth embodiments are the light emission spectrums having the composition ratios for the comparison with those of first to fourth embodiments. Hereinafter, the first comparative example and the first to fourth embodiments will be understood by making reference to the disclosed description.

The fifth embodiment shows light emission spectrums when the first phosphor is combined with the second phosphor, and the combination ratio of the first and second phosphors is 69:31. The sixth to eighth embodiments show light emission spectrums when the first to third phosphors are combined. In the sixth embodiment, the combination ratio among the first to third phosphors is 70:29:1. In the seventh embodiment, the combination ratio among the first to third phosphors is 81:7:12. In the eighth embodiment, the combination ratio among the first to third phosphors is 84:1:15.

Referring to FIGS. 13 and 14, according to the fifth to eighth embodiments, the gradient deviation of the second light emission spectrum is 0.006 in the range of 540 nm to 580 nm. The gradient deviation according to the fifth to eighth embodiments show values greater than those of the first to fourth embodiments. For example, according to the fifth to eighth embodiments, the gradient deviation of the second light emission spectrums exceeds 0.006. In detail, the gradient deviation of the second light emission spectrums is in the range of 6% to 10%.

Figure 15:
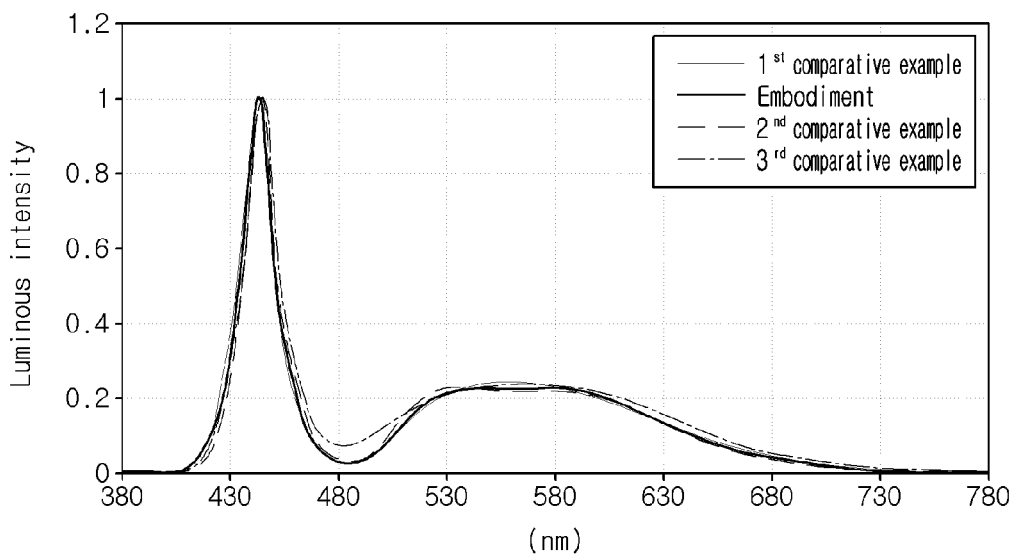
FIG. 15 is a graph showing the light emission spectrum according to the first, second, and third comparative examples and the embodiment.
Figure 16:
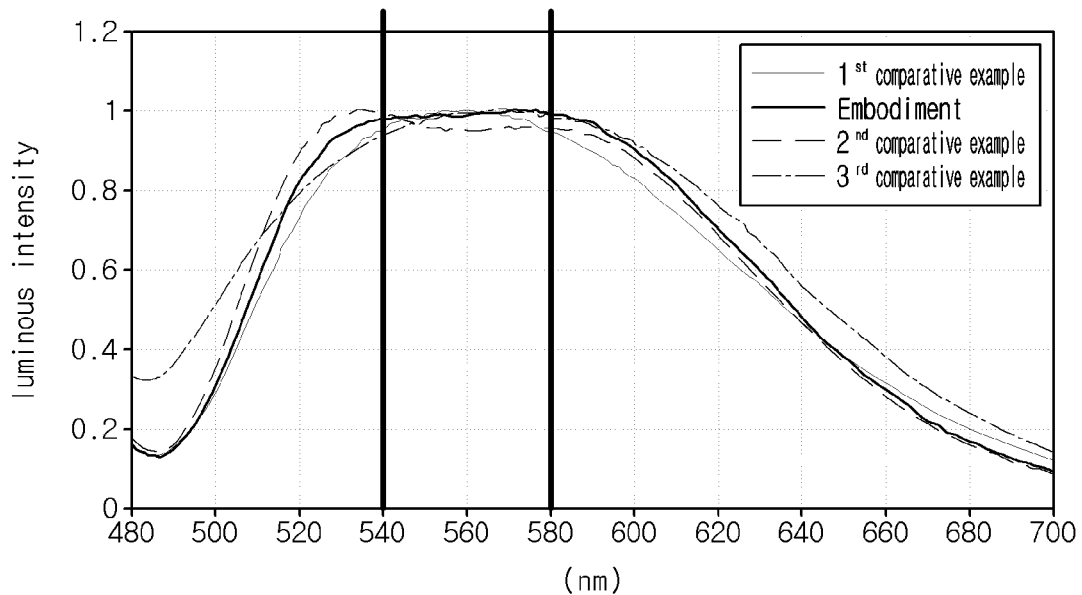
FIG. 16 is a graph showing light emission spectrums according to the first, second, and third comparative examples and the embodiment normalized based on a blue spectrum of FIG. 15.

FIG. 15 is a graph showing light emission spectrums of phosphors according to first to third comparative examples and the embodiment. FIG. 16 is a graph showing the light emission spectrums according to first to third comparative examples and the embodiment that are normalized.

In FIGS. 15 and 16, the first comparative example is a light emission spectrum of a YAG yellow phosphor, the embodiment is the second light emission spectrum by green/yellow/red nitride phosphors, the second comparative example is a light emission spectrum representing a mixed color by a green nitride phosphor, a yellow silicate-based phosphor, and a red nitride phosphor, and the third comparative example is a light emission spectrum representing a mixed color by a green LuAG phosphor and a red nitride-based phosphor.

As shown in FIGS. 15 and 16, when comparing the first, second, and third comparative examples with the embodiment, the second light emission spectrum according to the embodiment represents the gradient deviation less than those of the first, second, and third comparative examples in the flat section. For example, the second light emission spectrum according to the first comparative example represents the gradient deviation greater than that of the embodiment in the peak wavelengths in the range of 540 nm to 580 nm. The second light emission spectrum according to the second comparative example rarely has the flat section in the peak wavelength range of 540 nm to 580 nm. The second light emission spectrum according to the third comparative example represents the gradient deviation greater than that of the embodiment in the peak wavelength range of 540 nm to 560 nm. According to the embodiment, the second light emission spectrum has a small gradient deviation in the peak wavelength range of 540 nm to 580 nm, and has the substantially same luminous intensity about the peak wavelength. Therefore, the color reproduction rate can be improved due to the second light emission spectrum according to the embodiment, and cover areas may be widened in the speed of light or the standard color space. In addition, according to the embodiment, even if a plurality of phosphors are combined with each other, the degradation of the light efficiency can be prevented due to the wide FWHM.

Figure 17:
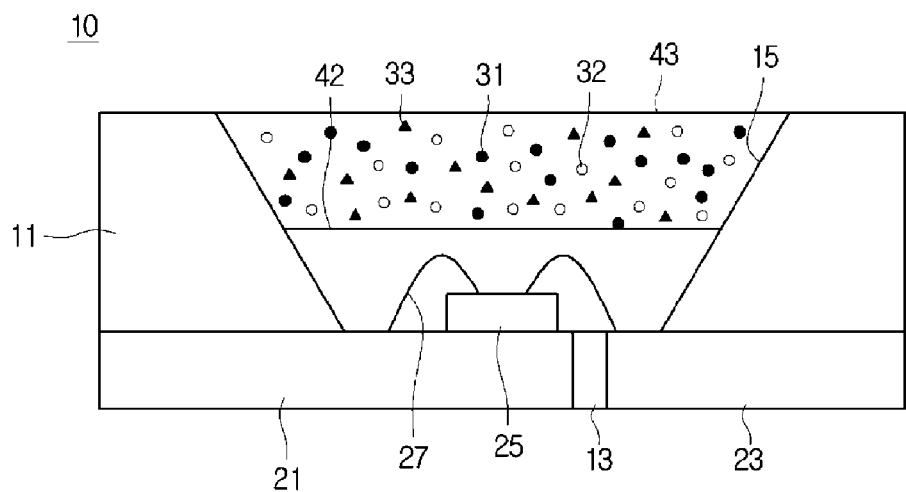
FIG. 17 is a sectional view showing a light emitting device according to a second embodiment having the phosphor according to the embodiment.

FIG. 17 is a sectional view showing a light emitting device according to the second embodiment having the phosphors according to the embodiment. In the following description of features shown in FIG. 17, the features the same as those of FIG. 1 can be understood by making reference to the description of the features of FIG. 1.

Referring to FIG. 17, the first to third phosphors 31, 32, and 33 may be spaced apart from the light emitting chip 25. For example, phosphors are not contained in a first molding member 42 making contact with the light emitting chip 25, and the first and third phosphors 31, 32, and 33 may be contained in a second molding member 43 disposed on the first molding member 42. Therefore, the first to third phosphors 31, 32, and 33 can be prevented from being damaged by the heat emitted from the light emitting chip 25.

The first and second molding members 42 and 43 may include the same resin material such as silicon or epoxy. The first to third phosphors 31, 32, and 33 include nitride-based phosphors and represent green, yellow, and red colors, respectively. The compositional formulas of the first to third phosphors 31, 32, and 33 and the second light emission spectrum of the first to third phosphors 31, 32, and 33 may be understood by making reference to the above disclosed description.

Figure 18:
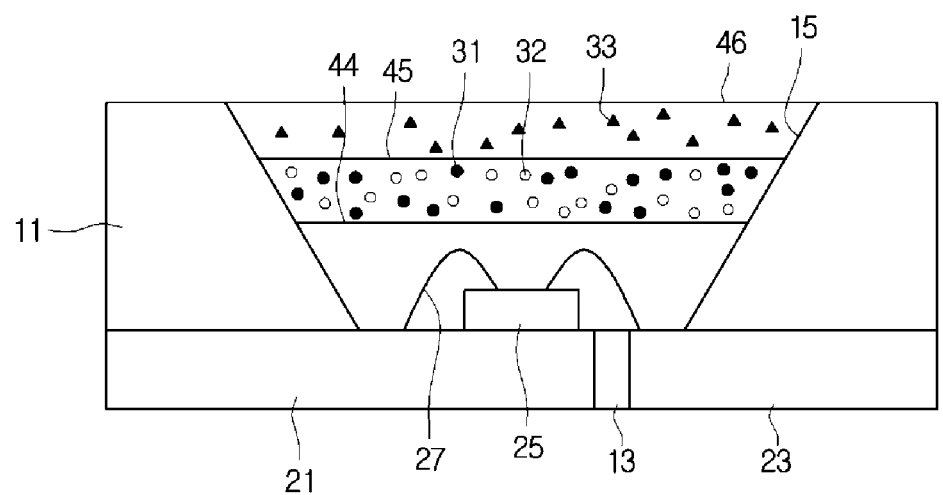
FIG. 18 is a sectional view showing a light emitting device according to a third embodiment having the phosphor according to the embodiment.

FIG. 18 is a sectional view showing a light emitting device according to a third embodiment having the phosphors according to the embodiment. In the following description of features shown in FIG. 18, the features the same as those of FIG. 1 can be understood by making reference to the description of the features of FIG. 1.

Referring to FIG. 18, at least one or at least two of the first to third phosphors 31, 32, and 33 may be contained in mutually different molding members. For example, the first and second phosphors may be contained in the second molding member 45, and the third phosphor may be contained in the third molding member 46. The first to third phosphors 31, 32, and 33 include nitride-based phosphors and are green, yellow, and red phosphors, respectively. The light emitting chip 25 contained in the body 11 makes contact with a first molding member 44 so that the light emitting chip 25 is protected from the first molding member 44. A second molding member 45 is disposed on the first molding member 44, and a third molding member 46 is disposed on the second molding member 45. At least two of the first to third phosphors 31, 32, and 33 may be contained in one of the molding members, and a remaining one phosphor may be contained in another molding member.

The first to third molding members 44, 45, and 46 may include the same transmissive resin material or resin materials making a difference in a refractive index therebetween, but the embodiment is not limited thereto.

According to another example, when a plurality of molding members are disposed in the cavity 15, two phosphors having lower peak wavelengths, for example the first and second phosphors 31 and 32, among the first to third phosphors 31, 32, and 33, may be contained in a molding member located at a lower position that that of the third phosphor 33. According to another example, two phosphors having higher peak wavelengths, for example the second and third phosphors 32 and 33, among the first to third phosphors 31, 32, and 33, may be contained in a molding member located at a lower position that the molding member having the first phosphor 31.

The first to third phosphors 31, 32, and 33 may be distributed adjacent to the top surface of each molding member or on the bottom surface of each molding member. For example, a greater amount of the first and second phosphors 31 and 32 may be distributed on the top surface or the bottom surface of the second molding member 32. A greater amount of the third phosphor 33 may be distributed on one of the top surface and the bottom surface of the third molding member 33.

Figure 19:
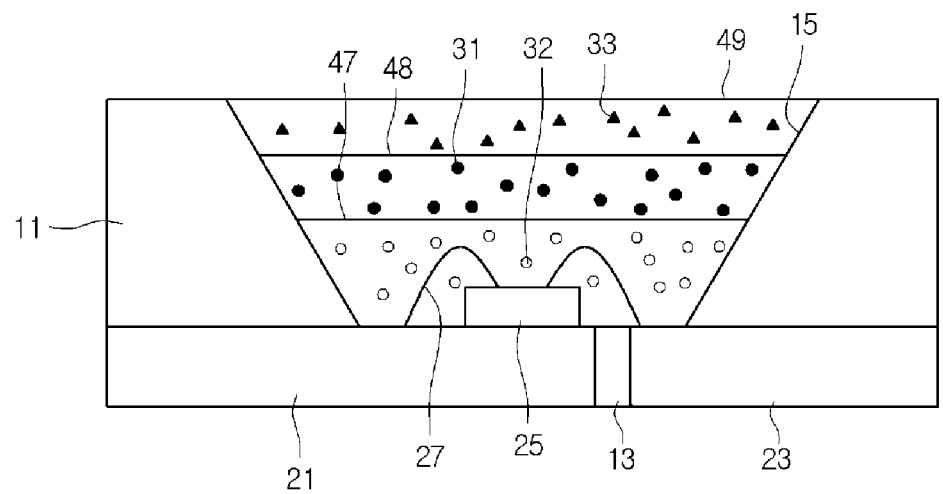
FIG. 19 is a sectional view showing a light emitting device according to a fourth embodiment having the phosphor according to the embodiment.

FIG. 19 is a sectional view showing a light emitting device according to the third embodiment having the phosphor according to the embodiment. In the following description of features shown in FIG. 19, the features the same as those of FIG. 1 can be understood by making reference to the description of the features of FIG. 1.

Referring to FIG. 19, the first to third phosphors 31, 32, and 33 may be provided in mutually different molding members 47, 48, and 49. For example, one of the first to third phosphors 31, 32, and 33 (e.g., the second phosphor 32) may be contained in the first molding member 47. One of the first to third phosphors 31, 32, and 33 (e.g., the first phosphor 31) may be contained in the second molding member 48. One of the first to third phosphors 31, 32, and 33 (e.g., the third phosphor 33) may be contained in the third molding member 49.

According to another example, when the molding members 47, 48, and 49 are disposed in the cavity 15, the first to third phosphors 31, 32, and 33 may be contained in the first to third molding members 47, 48, and 49 in order from a lower peak wavelength from a higher peak wavelength while maintaining the sequence of the first to third molding members 47, 48, and 49. According to another example, when the molding members 47, 48, and 49 are disposed in the cavity 15, the first to third phosphors 31, 32, and 33 may be contained in the first to third molding members 47, 48, and 49 in order from a higher peak wavelength from a lower peak wavelength while maintaining the sequence of the first to third molding members 47, 48, and 49. The containment position and the containment of the first to third phosphors 31, 32, and 33 may be changed, but the embodiment is not limited thereto.

<Lighting System>

The light emitting device according to the embodiment is applicable to a lighting system. The lighting system includes a structure in which a plurality of light emitting devices are arrayed. The lighting system includes a display apparatus shown in FIGS. 20 and 21, a lighting apparatus shown in FIG. 22, a lighting lamp, a camera flash, a signal lamp, a headlamp for a vehicle, and an electronic display.

Figure 20:
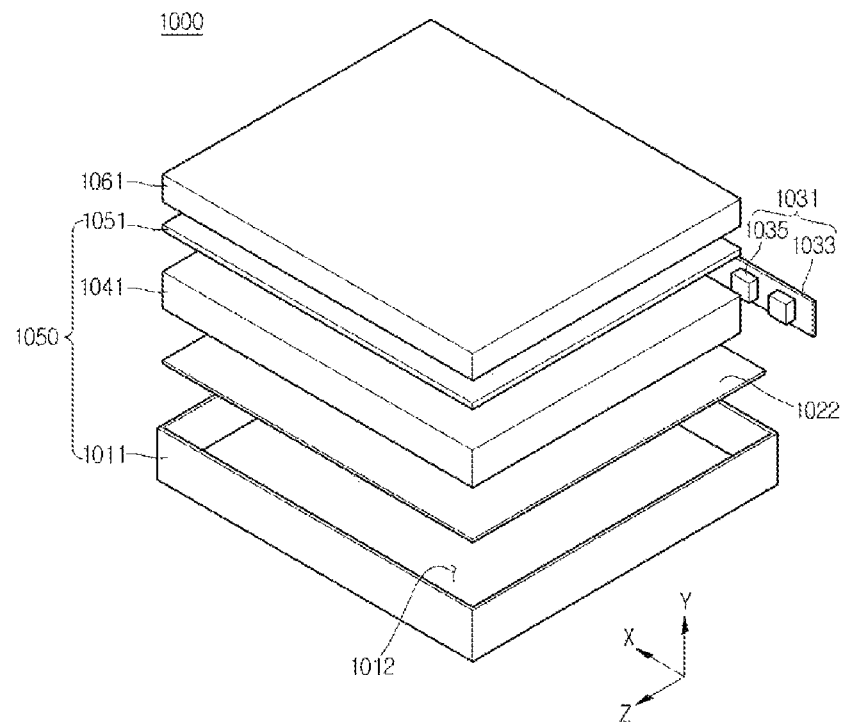
FIG. 20 is a perspective view showing a display apparatus having the light emitting device or light emitting device package according to the embodiment.

FIG. 20 is an exploded perspective view showing a display apparatus having the light emitting device according to the embodiment.

Referring to FIG. 20, a display apparatus 1000 according to the embodiment includes a light guide plate 1041, a light source module 1031 to supply light to the light guide plate 1041, a reflective member 1022 under the light guide plate 1041, an optical sheet 1051 on the light guide plate 1041, a display panel 1061 on the optical sheet 1051, and a bottom cover 1011 to receive the light guide plate 1041, the light source module 1031, and the reflective member 1022, but the embodiment is not limited thereto.

The bottom cover 1011, the reflective sheet 1022, the light guide plate 1041, the optical sheet 1051, and the light unit 1050 may be defined as a backlight unit.

The light guide plate 1041 diffuses the light supplied from the light source module 1033 to provide surface light. The light guide plate 1041 may include a transparent material. For example, the light guide plate 1041 may include one of acryl-based resin, such as PMMA (polymethyl methacrylate, PET (polyethylene terephthalate), PC (polycarbonate), COC (cyclic olefin copolymer) and PEN (polyethylene naphtha late) resin.

The light source module 1031 is disposed on at least one side of the light guide plate 1041 to supply the light to at least one side of the light guide plate 1041. The light source module 1031 serves as the light source of the display device.

At least one light source module 1031 is disposed to directly or indirectly supply the light from one side of the light guide plate 1041. The light source module 1031 may include a board 1033 and the light emitting device according to the embodiments or the light emitting device 1035. The light emitting device or the light emitting device 1035 are arranged on the board 1033 while being spaced apart from each other at the predetermined interval.

The board 1033 may include a printed circuit board (PCB) including a circuit pattern (not shown). In addition, the board 1031 may also include a metal core PCB (MCPCB) or a flexible PCB (FPCB) as well as a typical PCB, but the embodiment is not limited thereto. If the light emitting device 1035 is installed on the side of the bottom cover 1011 or on a heat dissipation plate, the board 1033 may be omitted. The heat dissipation plate partially makes contact with the top surface of the bottom cover 1011.

In addition, the light emitting device 1035 are arranged such that light exit surfaces to discharge light of the light emitting device 1035 are spaced apart from the light guide plate 1041 by a predetermined distance on the board 1033, but the embodiment is not limited thereto. The light emitting device 1035 may directly or indirectly supply the light to a light incident surface, which is one side of the light guide plate 1041, but the embodiment is not limited thereto.

The reflective member 1022 is disposed below the light guide plate 1041. The reflective member 1022 reflects the light, which is traveled downward through the bottom surface of the light guide plate 1041, toward the display panel 1061, thereby improving the brightness of the light unit 1050. For example, the reflective member 1022 may include PET, PC or PVC resin, but the embodiment is not limited thereto. The reflective member 1022 may serve as the top surface of the bottom cover 1011, but the embodiment is not limited thereto.

The bottom cover 1011 may receive the light guide plate 1041, the light source module 1031, and the reflective member 1022 therein. To this end, the bottom cover 1011 has a receiving section 1012 having a box shape with an opened top surface, but the embodiment is not limited thereto. The bottom cover 1011 can be coupled with the top cover (not shown), but the embodiment is not limited thereto.

The bottom cover 1011 can be manufactured through a press process or an extrusion process by using metallic material or resin material. In addition, the bottom cover 1011 may include metal or non-metallic material having superior thermal conductivity, but the embodiment is not limited thereto.

The display panel 1061, for example, is an LCD panel including first and second transparent substrates, which are opposite to each other, and a liquid crystal layer interposed between the first and second substrates. A polarizing plate can be attached to at least one surface of the display panel 1061, but the embodiment is not limited thereto. The display panel 1061 displays information by allowing the light to pass therethrough. The display device 1000 can be applied to various portable terminals, monitors of notebook computers, monitors or laptop computers, and televisions.

The optical sheet 1051 is disposed between the display panel 1061 and the light guide plate 1041 and includes at least one transmissive sheet. For example, the optical sheet 1051 includes at least one selected from the group consisting of a diffusion sheet, a horizontal and vertical prism sheet, and a brightness enhanced sheet. The diffusion sheet diffuses the incident light, the horizontal and vertical prism sheet concentrates the incident light onto the display panel 1061, and the brightness enhanced sheet improves the brightness by reusing the lost light. In addition, a protective sheet can be disposed on the display panel 1061, but the embodiment is not limited thereto.

The light guide plate 1041 and the optical sheet 1051 can be disposed in the light path of the light source module 1031 as optical members, but the embodiment is not limited thereto.

Figure 21:
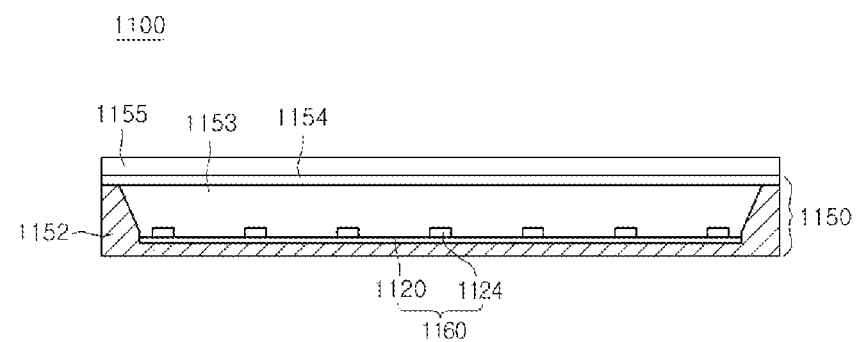
FIG. 21 is a sectional view showing a display apparatus having the light emitting device or light emitting device package according to the embodiment.

FIG. 21 is a sectional view showing a display apparatus according to the embodiment.

Referring to FIG. 21, the display device 1100 includes a bottom cover 1152, a board 1120 on which the light emitting device 1124 are arrayed, an optical member 1154, and a display panel 1155.

The board 1120 and the light emitting device 1124 may constitute the light source module 1160. In addition, the bottom cover 1152, at least one light source module 1160, and the optical member 1154 may constitute the light unit 1150. The bottom cover 1151 can be disposed with a receiving section 1153, but the embodiment is not limited thereto. The light source module 1160 includes a board 1120, and a plurality of light emitting devices arranged on the board 1120 or a light emitting device 1124.

The optical member 1154 may include at least one selected from the group consisting of a lens, a light guide plate, a diffusion sheet, a horizontal and vertical prism sheet, and a brightness enhanced sheet. The light guide plate may include PC or PMMA (Poly methyl methacrylate). The light guide plate can be omitted. The diffusion sheet diffuses the incident light, the horizontal and vertical prism sheet concentrates the incident light onto a display region, and the brightness enhanced sheet improves the brightness by reusing the lost light.

The optical member 1154 is disposed above the light source module 1160 in order to convert the light emitted from the light source module 1160 into the surface light.

Figure 22:
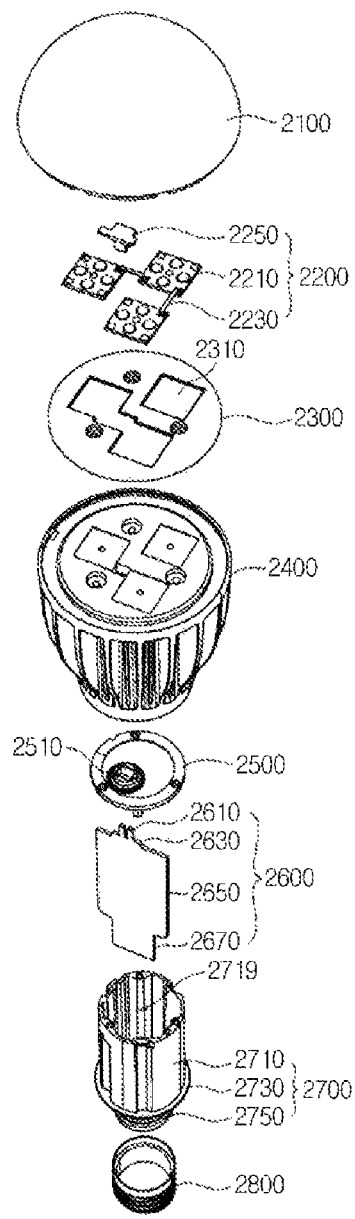
FIG. 22 is an exploded perspective view showing a lighting device having the light emitting device or light emitting device package according to the embodiment.

FIG. 22 is an exploded perspective view showing a lighting device having the light emitting device according to the embodiment.

Referring to FIG. 22, the lighting device according to the embodiment may include a cover 2100, a light source module 2200, a heat radiation member 2400, a power supply part 2600, an inner case 2700, and a socket 2800. In addition, the light emitting device according to the embodiment may further include at least one of a member 2300 and a holder 2500. The light source module 2200 may include the light emitting device according to the embodiment.

For example, the cover 2100 has the shape of a bulb, or a hemispherical shape. The cover 2100 may have a hollow structure, and a portion of the cover 2100 may be open. The cover 2100 may be optically connected to the light source module 2200, and may be coupled with the heat radiation member 2400. The cover 2100 may have a recess part coupled with the heat radiation member 2400.

The inner surface of the cover 2100 may be coated with ivory white pigments serving as a diffusing agent. The light emitted from the light source module 2200 may be scattered or diffused by using the ivory white material, so that the light can be discharged to the outside.

The cover 2100 may include glass, plastic, PP, PE, or PC. In this case, the PC represents superior light resistance, superior heat resistance, and superior strength. The cover 2100 may be transparent so that the light source module 2200 may be recognized at the outside. In addition, the cover 2100 may be opaque. The cover 2100 may be formed through a blow molding scheme.

The light source module 2200 may be disposed at one surface of the heat radiation member 2400. Accordingly, the heat emitted from the light source module 2200 is conducted to the heat radiation member 2400. The light source module 2200 may include a light emitting device 2210, a connection plate 2230, and a connector 2250.

The member 2300 is disposed on the top surface of the heat radiation member 2400, and has a guide groove 2310 having a plurality of light emitting devices 2210 and a connector 2250 inserted into the guide groove 2310. The guide groove 2310 corresponds to the substrate of the light emitting device 2210 and the connector 2250.

White pigments may be applied to or coated on the surface of the member 2300. The member 2300 reflects light, which reflected by the inner surface of the cover 2100 to return to the light source module 2200, toward the cover 2100. Accordingly, the light efficiency of the lighting apparatus according to the embodiment can be improved.

The member 2300 may include an insulating material. The connection plate 2230 of the light source module 2200 may include an electric-conductive material. Accordingly, the heat radiation member 2400 may be electrically connected to the connection plate 2230. The member 2300 includes an insulating material to prevent the electrical short between the connection plate 2230 and the heat radiation member 2400. The heat radiation member 2400 receives heat from the light source module 2200 and the heat from the power supply part 2600 and radiates the heats.

The holder 2500 blocks a receiving groove 2719 of an insulating part 2710 disposed in an internal case 2700. Accordingly, the power supply part 2600 received in the insulating part 2710 of the internal case 2700 is sealed. The holder 2500 has a guide protrusion part 2510. The guide protrusion part 2510 may include a hole allowing a protrusion part 2610 of the power supply part 2600 to pass therethrough.

The power supply part 2600 processes and transforms an electrical signal received from the outside and supplies the electrical signal to the light source module 2200. The power supply part 2600 is received in the receiving groove 2719 of the internal case 2700, and sealed in the internal case 2700 by the holder 2500.

The power supply part 2600 may include a protrusion part 2610, a guide part 2630, a base 2650, and an extension part 2670.

The guide part 2630 protrudes outward from one side of the base 2650. The guide part 2630 may be inserted into the holder 2500. A plurality of parts may be disposed on one surface of the base 2650. For example, the parts include a DC converter, a driving chip to drive the light source module 2220, and an ESD (electrostatic discharge) protective device to protect the light source module 2200, but the embodiment is not limited thereto.

The extension part 2670 protrudes outward from another side of the base 2650. The extension part 2670 is inserted into the connection part 2750 of the internal case 2700, and receives an electrical signal from the outside. For example, the extension part 2670 may be equal to or less than the width of the connection part 2750 of the internal case 2700. The extension part 2670 may be electrically connected to the socket 2800 through a wire.

The internal case 2700 may be disposed therein with a molding part together with the power supply part 2600. The molding part is formed by hardening a molding liquid, so that the power supply part 2600 may be fixed into the internal case 2700.

According to the embodiment, the light emitting device having the combination of new nitride phosphors can be provided. According to the embodiment, the nitride phosphor having the improved color reproduction rate can be provided. According to the embodiment, phosphors having the improved speed of light and a wide standard color space can be provided. According to the embodiment, phosphors having the flat luminous intensity in the section of at least 35 nm can be provided. According to the embodiment, the phosphor capable of reducing the deviation of the light emission spectrum in the section of at least 35 nm can be provided.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
    a light emitting chip;
    a plurality of phosphors to absorb a portion of light emitted from the light emitting chip and to emit lights having mutually different peak wavelengths; and
    a molding member provided on the light emitting chip and including the phosphors,
    wherein the phosphors comprise:
       a first phosphor to emit light having a first peak wavelength;
       a second phosphor to absorb the portion of the light emitted from the light emitting chip and to emit light having a second peak wavelength; and
       a third phosphor to absorb the portion of the light emitted from the light emitting chip and to emit light having a third peak wavelength,
    wherein the first to third peak wavelengths have mutually different color spectrums,
    wherein a light emission spectrum in which the first to third peak wavelengths are mixed with each other has a luminous intensity having a flat section in at least 30 nm at a peak wavelength thereof,
    wherein the flat section has a gradient having a deviation of 0.4% or less based on a horizontal linear line of the luminous intensity at the peak wavelength,
    wherein the first phosphor has a content having at least 70% of a sum of contents of the first to third phosphors, and
    wherein the first phosphor is a green phosphor and is formed of one type of phosphor.

2. The light emitting device of claim 1, wherein the first to third phosphors comprise mutually different nitride phosphors.

3. The light emitting device of claim 2, wherein the second phosphor comprise yellow phosphor, and the third phosphor comprises red phosphor.

4. The light emitting device of claim 3, wherein the light emission spectrum has a peak wavelength in a range of 520 nm to 600 nm.

5. The light emitting device of claim 4, wherein the light emission spectrum has the flat section of the luminous intensity at the peak-wavelength in a peak wavelength range of 540 nm to 580 nm.

6. The light emitting device of claim 3, the light emission spectrum of the first to third peak wavelengths has a full width half max of 120 nm.

7. The light emitting device of claim 3, wherein the light emission spectrum comprises a greenish yellow light.

8. The light emitting device of claim 3, wherein the light emitting chip emits blue light or ultraviolet light, and the light emission spectrum comprises yellow based light.

9. The light emitting device of claim 3, wherein the first phosphor has a content three times greater than a content of the second phosphor.

10. The light emitting device of claim 9, wherein the first phosphor has a content seven times greater than a content of the third phosphor.

11. The light emitting device of claim 3, wherein the first phosphor comprises at least two selected from the group consisting of N, La, Si, Ba, Al, Ca, and Sr, the second phosphor comprises at least two selected from the group consisting of N, Mg, Ca, Sr, Ba, and Zn, and the third phosphor comprises at least one selected from the group consisting of N, Be, Mg, Ca, Sr, Ba, and Zn, and at least one selected from the group consisting of C, Si, Ge, Sn, Ti, Zr, and Hf.

12. The light emitting device of claim 3, wherein the molding member comprises a plurality of molding members, and at least two of the first to third phosphors are disposed in at least one of the molding members.

13. The light emitting device of claim 1, wherein the flat section is in a range of 35 nm to 40 nm at the peak-wavelength in a peak wavelength range of 540 nm to 580 nm.

14. The light emitting device of claim 1, wherein the flat section is in a range of 0.29 to 0.33 of the full width half max of the light emission spectrum which has a peak wavelength in a range of 520 nm to 600 nm.

15. A light emitting device comprising:
a light emitting chip;
a plurality of phosphors to absorb a portion of light emitted from the light emitting chip and to emit lights having mutually different peak wavelengths; and
a molding member provided on the light emitting chip and comprising the phosphors,
wherein the phosphors have mutually different color spectrums,
wherein a light emission spectrum of a mixture of lights emitted from the phosphors comprises yellow based light,
wherein a luminous intensity at a peak wavelength of the light emission spectrum has a flat section in a range of 35 nm to 40 nm,
wherein the flat section has a gradient having a deviation of 0.4% or less based on a horizontal linear line of the luminous intensity at the peak wavelength,
wherein one of the plurality of phosphors has a content having at least 70% of a sum of contents of the plurality of phosphors,
wherein the one of the plurality of phosphors is a green phosphor and is formed of one type of phosphor,
wherein the phosphors includes a first phosphor to emit light having a first peak wavelength, a second phosphor to absorb the portion of the light emitted from the light emitting chip and to emit light having a second peak wavelength, and a third phosphor to absorb the portion of the light emitted from the light emitting chip and to emit light having a third peak wavelength, and
wherein the first to third phosphors comprise mutually different nitride phosphors.

16. The light emitting device of claim 15, wherein the first to third phosphors comprise green, yellow, and red phosphors, respectively, and the light emission spectrum has the flat section of the luminous intensity at the peak-wavelength in a peak wavelength range of 540 nm to 580 nm.

17. The light emitting device of claim 16, wherein the first phosphor has a content which is three times greater than a content of the second phosphor, seven times greater than a content of the third phosphor, and at least 70% of a sum of contents of the first to third phosphors, and
wherein the first phosphor comprises at least two selected from the group consisting of N, La, Si, Ba, Al, Ca, and Sr, the second phosphor comprises at least two selected from the group consisting of N, Mg, Ca, Sr, Ba, and Zn, and the third phosphor comprises at least one selected from the group consisting of N, Be, Mg, Ca, Sr, Ba, and Zn, and at least one selected from the group consisting of C, Si, Ge, Sn, Ti, Zr, and Hf.

18. The light emitting device of claim 16, wherein the first phosphor has a content having at least 70% of a sum of contents of the first to third phosphors.

19. The light emitting device of claim 16, wherein the phosphors consists of three types of phosphors.

* * * * *